(12) United States Patent
Chen et al.

(10) Patent No.: US 11,251,309 B2
(45) Date of Patent: Feb. 15, 2022

(54) THIN FILM TRANSISTOR COMPRISING LIGHT SHIELDING LAYER AND LIGHT BLOCKING PORTION AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventors: Jiangbo Chen, Beijing (CN); Young Suk Song, Beijing (CN); Wei Li, Beijing (CN); Liangchen Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/999,687

(22) PCT Filed: Dec. 14, 2017

(86) PCT No.: PCT/CN2017/116200
§ 371 (c)(1),
(2) Date: Aug. 20, 2018

(87) PCT Pub. No.: WO2018/205606
PCT Pub. Date: Nov. 15, 2018

(65) Prior Publication Data
US 2019/0378930 A1    Dec. 12, 2019
US 2020/0381561 A9    Dec. 3, 2020

(30) Foreign Application Priority Data
May 12, 2017   (CN) .......................... 201710334764.8

(51) Int. Cl.
*H01L 29/786*   (2006.01)
*H01L 27/32*   (2006.01)
(Continued)

(52) U.S. Cl.
CPC .... *H01L 29/78633* (2013.01); *H01L 27/3272* (2013.01); *H01L 29/41733* (2013.01);
(Continued)

(58) Field of Classification Search
CPC ..................... H01L 29/78633; H01L 27/3272
See application file for complete search history.

(56) References Cited

U.S. PATENT DOCUMENTS 6,583,440 B2    6/2003   Yasukawa
2002/0050795 A1   5/2002   Imura
(Continued)

FOREIGN PATENT DOCUMENTS

CN    101093851 A    12/2007
CN    102197485 A    9/2011
(Continued)

OTHER PUBLICATIONS

PCT International Search Report, Application No. PCT/CN2017/116200, dated Mar. 23, 2018, 6 pages: with English translation.
(Continued)

*Primary Examiner* — Daniel Whalen
(74) *Attorney, Agent, or Firm* — Armstrong Teasdale LLP

(57) ABSTRACT

Embodiments of the present disclosure relate to a thin film transistor, a method for manufacturing the same, a display panel, and a display device. The thin film transistor includes a substrate, an active layer located on the substrate, and a light shielding layer, a first dielectric layer, and a second dielectric layer located between the substrate and the active layer, wherein the first dielectric layer is located between the second dielectric layer and the substrate, and wherein a refractive index of the first dielectric layer is greater than a refractive index of the second dielectric layer.

7 Claims, 9 Drawing Sheets

(51) Int. Cl.
*H01L 29/417* (2006.01)
*H01L 29/423* (2006.01)

(52) U.S. Cl.
CPC .. *H01L 29/42384* (2013.01); *H01L 29/78603* (2013.01); *H01L 29/78648* (2013.01)

(56) References Cited

U.S. PATENT DOCUMENTS

| | | |
|---|---|---|
| 2011/0299004 A1 | 12/2011 | Liu et al. |
| 2012/0175615 A1 | 7/2012 | You et al. |
| 2014/0118656 A1 | 5/2014 | Jang et al. |
| 2014/0124761 A1 | 5/2014 | Jeon et al. |
| 2014/0183476 A1 | 7/2014 | Kwon et al. |
| 2015/0036083 A1 | 2/2015 | Jang et al. |
| 2017/0062546 A1* | 3/2017 | Kim .................... H01L 27/3276 |
| 2017/0309242 A1* | 10/2017 | Kim .................. G02F 1/136209 |
| 2018/0067368 A1* | 3/2018 | Izawa .................... G02F 1/1368 |
| 2018/0182865 A1* | 6/2018 | Hao ........................ H01L 21/77 |

FOREIGN PATENT DOCUMENTS

| | | |
|---|---|---|
| CN | 102593145 A | 7/2012 |
| CN | 103268878 A | 8/2013 |
| CN | 104218092 A | 12/2014 |
| CN | 104871321 A | 8/2015 |
| CN | 104992948 A | 10/2015 |
| CN | 106229338 A | 12/2016 |
| CN | 106328586 A | 1/2017 |
| EP | 2506303 A1 | 10/2012 |
| JP | 2000091584 A | 3/2000 |
| JP | 2000180899 A | 6/2000 |
| JP | 2001033822 A | 2/2001 |
| JP | 2003229573 A | 8/2003 |
| JP | 2010027830 A | 2/2010 |
| JP | 2010074030 A | 4/2010 |
| JP | 2010147368 A | 7/2010 |
| KR | 20150002279 A | 1/2015 |

OTHER PUBLICATIONS

PCT Written Opinion, Application No. PCT/CN2017/116200, dated Mar. 23, 2018, 5 pages.: with English translation of relevant part.
China First Office Action, Application No. 201710334764.8, dated Mar. 4, 2020, 27 pps.: with English translation.
China Second Office Action, Application No. 201710334764.8, dated Sep. 14, 2020, 15 pps.: with English translation.
Indian First Examination Report, Application No. 201827031138, dated Oct. 12, 2020, 5 pps.
JP Notice of Reasons for Refusal, Application No. 2018543629, dated Apr. 15, 2021, 7 pps.
European Extended Search Report, Application No. 17896318.7, dated Feb. 5, 2021, 10 pps.

* cited by examiner

THIN FILM TRANSISTOR COMPRISING LIGHT SHIELDING LAYER AND LIGHT BLOCKING PORTION AND METHOD FOR MANUFACTURING THE SAME, DISPLAY PANEL AND DISPLAY DEVICE

CROSS REFERENCE TO RELATED APPLICATIONS

This patent application is a National Stage Entry of PCT/CN2017/116200 filed on Dec. 14, 2017, which claims the benefit and priority of Chinese Patent Application No. 201710334764.8 filed on May 12, 2017, the disclosures of which are incorporated herein by reference in their entirety as part of the present application.

BACKGROUND

Embodiments of the present disclosure relate to a field of display technologies, and in particular, to a thin film transistor, a method for manufacturing the same, a display panel, and a display device.

As the continuous development of display technology, oxide thin film transistors have the characteristics of high electron mobility, low preparation temperature, and good uniformity, and thus are increasingly used by people. However, in top gate thin film transistors, the illumination of the light emitting unit will affect the thin film transistor, thereby affecting the light stability of the thin film transistor.

BRIEF DESCRIPTION

Embodiments of the present disclosure provide a thin film transistor, a method for manufacturing the same, a display panel, and a display device.

A first aspect of an embodiment of the present disclosure provides a thin film transistor. The thin film transistor includes a substrate, an active layer located on the substrate, and a light shielding layer, a first dielectric layer and a second dielectric layer located between the substrate and the active layer, wherein the first dielectric layer is located between the second dielectric layer and the substrate, a refractive index of the first dielectric layer is greater than a refractive index of the second dielectric layer.

In one embodiment, the light shielding layer is located between the substrate and the first dielectric layer.

In one embodiment, the thin film transistor further includes a light blocking portion being in the same layer of the light shielding layer and spaced apart from the light shielding layer on the substrate, wherein the first dielectric layer covers the light shielding layer and the light blocking portion.

In one embodiment, the number of the light blocking portions is at least two, and the light blocking portions are disposed on both sides of the light shielding layer.

In one embodiment, a material of the light blocking portion is the same as a material of the light shielding layer.

In one embodiment, a cross-sectional shape of the light blocking portion includes a triangle, a circle, or a trapezoid.

In one embodiment, the light shielding layer is located between the first dielectric layer and the second dielectric layer.

In one embodiment, the first dielectric layer includes silicon nitride and the second dielectric layer includes silicon oxide.

In one embodiment, the thin film transistor further includes a gate stack located on the active layer, wherein the active layer includes a channel region located under the gate stack and source/drain regions respectively located on both sides of the channel region, and wherein the gate stack includes a gate insulating layer and a gate located on the gate insulating layer, an interlayer insulating layer located on the second dielectric layer, the active layer, and the gate stack, wherein the interlayer insulating layer includes vias exposing the source/drain regions, source/drain electrodes located on the interlayer insulating layer and connected to the source/drain regions through the vias, and a passivation layer located on the interlayer insulating layer and the source/drain electrodes.

A second aspect of an embodiment of the present disclosure provides a method for manufacturing a thin film transistor. The method includes forming a light shielding layer and a first dielectric layer on a substrate, forming a second dielectric layer on the light shielding layer and the first dielectric layer to cover the light shielding layer and the first dielectric layer, wherein a refractive index of the first dielectric layer is greater than a refractive index of the second dielectric layer, and forming an active layer on the second dielectric layer.

In one embodiment, forming the light shielding layer and the first dielectric layer on the substrate includes forming the light shielding layer on the substrate, and forming the first dielectric layer on the light shielding layer and the substrate.

In one embodiment, the method further includes forming a light blocking portion being in the same layer of the light shielding layer and spaced apart from the light shielding layer on the substrate, wherein the first dielectric layer covers the light shielding layer and the light blocking portion.

In one embodiment, a material of the light blocking portion is the same as a material of the light shielding layer.

In one embodiment, forming the light shielding layer and the first dielectric layer on the substrate includes forming the first dielectric layer on the substrate, and forming the light shielding layer on the first dielectric layer.

In one embodiment, the method further includes forming a gate stack on the active layer, wherein the active layer includes a channel region located under the gate stack and source/drain regions respectively located on both sides of the channel region, and wherein the gate stack includes a gate insulating layer and a gate located on the gate insulating layer, forming an interlayer insulating layer to cover the second dielectric layer, the active layer, and the gate stack, patterning the interlayer insulating layer to simultaneously form vias exposing the source/drain regions in the interlayer insulating layer, forming a conductive layer on the interlayer insulating layer to fill the vias, patterning the conductive layer to form source/drain electrodes connected to the source/drain regions through the vias, and forming a passivation layer on the interlayer insulating layer and the source/drain electrodes.

A third aspect of an embodiment of the present disclosure provides a display panel including the thin film transistor described in the first aspect of the embodiment of the present disclosure.

In a fourth aspect of an embodiment of the present disclosure, there is provided a display device including the display panel described in the third aspect of the embodiment of the present disclosure.

Further aspects and regions of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1:
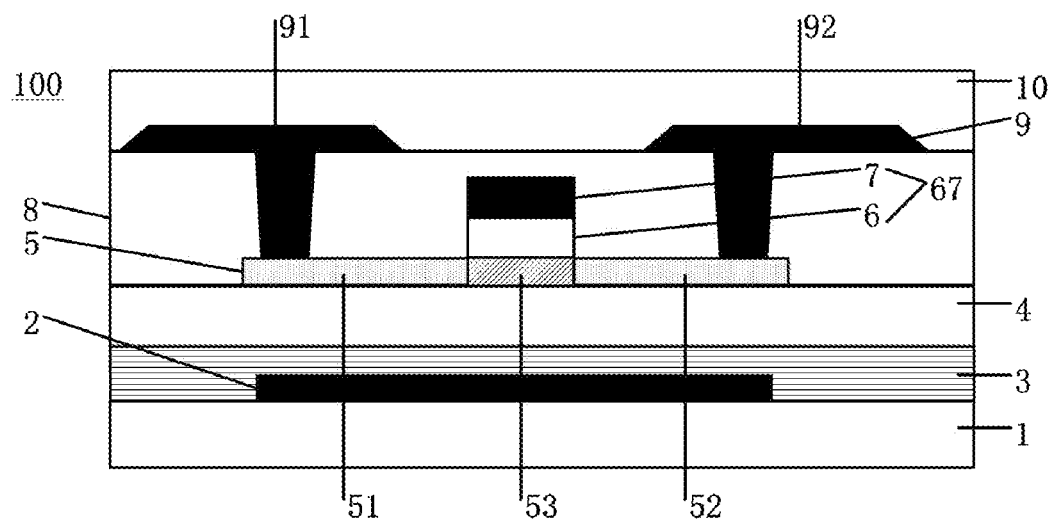
FIG. 1 is a schematic view of a cross section of a thin film transistor in accordance with an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

In addition, in the drawings, the thickness and area of each layer are exaggerated for clarity. It should be understood that when a layer, a region, or a component is referred to as being "on" another part, it is meant that it is directly on another part, or there may be other components in between. In contrast, when a certain component is referred to as being "directly" on another component, it is meant that no other component lies in between.

Further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

Example embodiments will now be described more fully with reference to the accompanying drawings.

When light emitted from a light emitting unit such as a backlight illuminates a thin film transistor from a substrate side of the thin film transistor, light incident to an active layer may have a potential adverse effect on the active layer, thereby affecting light stability of the thin film transistor. Therefore, a light shielding layer is generally disposed between the active layer and the substrate. The light shielding layer is capable of reflecting part of the incident light, thereby reducing the light incident to the active layer. However, the light incident from both sides of the light shielding layer is still incident to the active layer, thus affecting the light stability of the thin film transistor. The inventors have found through research that when the active layer is an oxide semiconductor, such an adverse effect induced by light incident from both sides of the light shielding layer is particularly remarkable.

In embodiments described herein, a thin film transistor is provided. A buffer layer in the thin film transistor includes a high refractive index dielectric layer and a low refractive index dielectric layer, such that light incident from both sides of a light shielding layer is reflected out from a substrate by a reflection at an interface of the high-low refractive index dielectric layer, or the above light propagates laterally between a top surface of the light shielding layer and a top surface of the high refractive index dielectric layer. This can reduce the light intensity incident to the active layer, thereby improving the light stability of the thin film transistor.

FIG. 1 is a schematic view of a cross section of a thin film transistor in accordance with an embodiment of the present disclosure. As shown in FIG. 1, the thin film transistor 100 includes a substrate 1, a light shielding layer 2 located on the substrate 1, a first dielectric layer 3 located on the substrate 1 and the light shielding layer 2, and a second dielectric layer 4 located on the first dielectric layer 3, an active layer 5 located on the second dielectric layer 4, a gate stack 67 located on the active layer 5, wherein the active layer 5 includes a channel region 53 located the gate stack 67 and source/drain regions 51, 52 respectively located on both sides of the channel region 53, and wherein the gate stack 67 includes a gate insulating layer 6 and a gate 7 located on the gate insulating layer 6, an interlayer insulating layer 8 located on the second dielectric layer 4, the gate stack 67, and the source/drain regions 51, 52, wherein the interlayer insulating layer 8 includes vias (not shown) exposing the source/drain regions 51, 52, source/drain electrode layer 9 located on interlayer insulating layer 8, wherein the source/drain electrode layer 9 includes source/drain electrodes 91, 92 respectively connected to the source/drain regions 51, 52 through vias, and a passivation layer 10 located on the interlayer insulating layer 8 and the source/drain electrode layer 9.

In an exemplary embodiment, a refractive index of the first dielectric layer 3 is greater than a refractive index of the second dielectric layer 4.

In an exemplary embodiment, the first dielectric layer 3 includes silicon nitride, and the second dielectric layer 4 includes silicon oxide, wherein the refractive index of the first dielectric layer 3 is 2.0 and the refractive index of the second dielectric layer 4 is 1.4. It is to be understood that materials of the first dielectric layer 3 and the second dielectric layer 4 are not limited to the above materials as long as the refractive index of the first dielectric layer 3 is greater than the refractive index of the second dielectric layer 4.

Since the density of silicon oxide is high, the diffusion of hydrogen in silicon nitride into the active layer can be reduced.

In an exemplary embodiment, the first dielectric layer 3 has a thickness of 100 nm to 500 nm, and the second dielectric layer 4 has a thickness of 5 nm to 1000 nm. In an exemplary embodiment, the first dielectric layer 3 has a thickness of 100 nm and the second dielectric layer 4 has a thickness of 200 nm.

In an exemplary embodiment, the substrate 1 is glass. It will be appreciated that the substrate 1 may be other well-known materials as long as the substrate 1 is transparent.

In an exemplary embodiment, the light shielding layer 2 includes a metal layer. In an exemplary embodiment, the light shielding layer 2 includes Mo, AlNd, Al, Cu, or the like. In an exemplary embodiment, the light shielding layer 2 has a thickness of 50 nm to 400 nm. In an exemplary embodiment, the light shielding layer 2 has a thickness of 100 nm.

In an exemplary embodiment, the active layer 5 includes a semiconductor material. It should be understood that the embodiments of the present disclosure are not particularly limited to the material of the semiconductor. In an exemplary embodiment, the active layer 5 includes an oxide semiconductor material such as IGZO, ITZO, or the like. In an exemplary embodiment, the active layer 5 has a thickness of 10 nm to 100 nm. In an exemplary embodiment, the active layer 5 has a thickness of 40 nm. In an exemplary embodiment, the gate insulating layer 6 includes silicon oxide. In an exemplary embodiment, the gate insulating layer 6 has a thickness of 100 nm to 500 nm. In an exemplary embodiment, the gate insulating layer 6 has a thickness of 150 nm.

In an exemplary embodiment, the gate 7 includes a MoNb/Cu/MoNb composite metal film layer. It can be understood that the gate of the embodiment of the present disclosure may also adopt other well-known composite metal film layers. In an exemplary embodiment, the gate 7 has a thickness of 200 nm to 1000 nm. In an exemplary embodiment, the gate 7 has a thickness of 480 nm.

In an exemplary embodiment, the interlayer insulating layer 8 includes silicon oxide. In an exemplary embodiment, the interlayer insulating layer 8 has a thickness of 100 nm to 500 nm. In an exemplary embodiment, the interlayer insulating layer 8 has a thickness of 300 nm.

In an exemplary embodiment, the source/drain electrode layer 9 includes Mo, Al, Cu, or a composite film layer thereof, or the like. In an exemplary embodiment, the source/drain electrode layer 9 has a thickness of 50 nm to 1000 nm. In an exemplary embodiment, the source/drain electrode layer 9 has a thickness of 480 nm.

In an exemplary embodiment, the passivation layer 10 includes silicon nitride or silicon oxide. In an exemplary embodiment, the passivation layer 10 has a thickness of 200 nm to 400 nm. In an exemplary embodiment, the passivation layer 10 has a thickness of 300 nm.

In this embodiment, the buffer layer employs a combination of a high refractive index dielectric layer and a low refractive index dielectric layer. In a case where light emitted from the light emitting unit illuminates the thin film transistor from the substrate side of the thin film transistor, when light is incident from the high refractive index dielectric layer to the low refractive index dielectric layer, the incident light is reflected out from the substrate by the reflection at the interface of the high refractive index dielectric layer and the low refractive index, or the above-described incident light propagates laterally between the top surface of the light shielding layer and the top surface of the high refractive index dielectric layer. Therefore, the light intensity entering the active layer of the thin film transistor is reduced, thereby improving the light stability of the thin film transistor.

Figure 2:
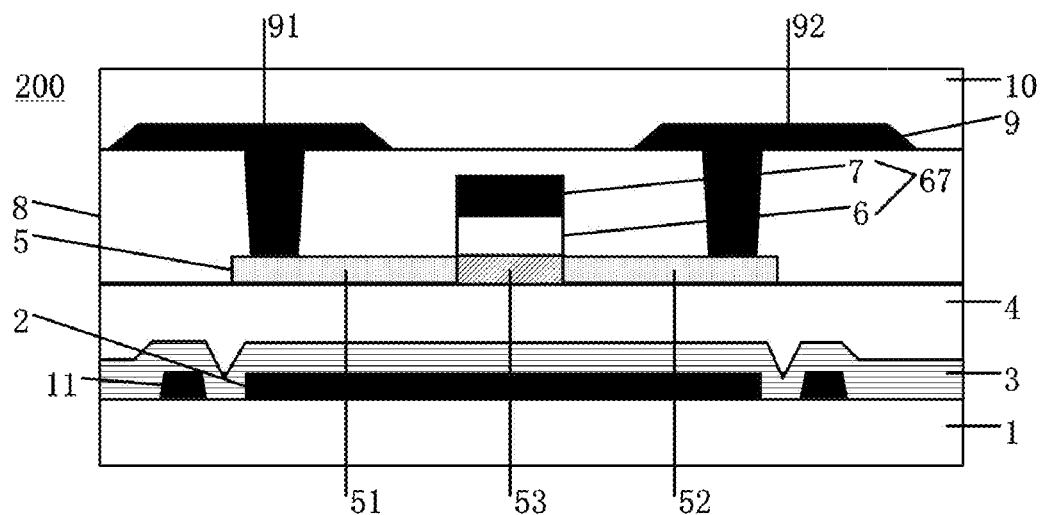
FIG. 2 is a schematic view of a cross section of a thin film transistor in accordance with an embodiment of the present disclosure.

FIG. 2 is a schematic view of a cross section of a thin film transistor in accordance with an embodiment of the present disclosure. As shown in FIG. 2, FIG. 2 differs from FIG. 1 in that, on the basis of FIG. 1, FIG. 2 further includes a light blocking portion 11 being in the same layer of the light shielding layer 2, spaced apart from the light shielding layer 2, and located on both sides of the light shielding layer 2 on the substrate 1. Also, the first dielectric layer 3 in FIG. 2 covers the light shielding layer 2, the light blocking portion 11, and the substrate 1. Thus, the light incident from both sides of the light shielding layer 2 is reflected and then emitted out from the thin film transistor 200 from the substrate side, so as to prevent light from propagating between the top surface of the light shielding layer 2 and the top surface of the first dielectric layer 3, thereby the light intensity entering the active layer 5 of the thin film transistor 200 is more effectively reduced. Therefore, the light stability of the thin film transistor is more effectively improved. In addition, the same portions of FIG. 2 as those of FIG. 1 are as described above, and will not be repeated again.

In an exemplary embodiment, the number of the light blocking portions 11 is at least two, and the light blocking portions 11 are disposed on both sides of the light shielding layer 2, as shown in FIG. 2.

In an exemplary embodiment, a material of the light blocking portion 11 is the same as a material of the light shielding layer 2. This makes it possible to simultaneously form the light blocking portion 11 and the light shielding layer 2 by patterning the same material layer once, such that the manufacturing steps can be simplified.

In FIG. 2, the cross-sectional shape of the light blocking portion 11 is a trapezoidal shape, in which the cross section is perpendicular to the substrate 1. In an exemplary embodiment, the cross-sectional shape of the light blocking portion 11 may be a triangle or a circle.

Figure 3A:
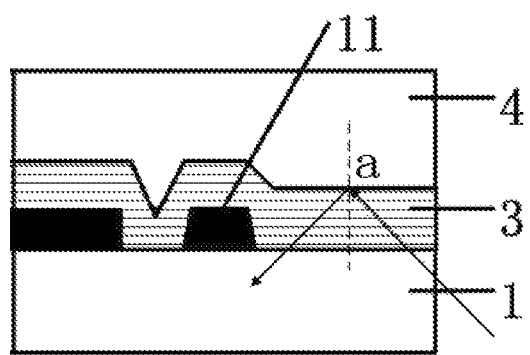
FIGS. 3A-3C are schematic views of a reflection effect of a light blocking portion in accordance with an embodiment of the present disclosure.
Figure 3B:
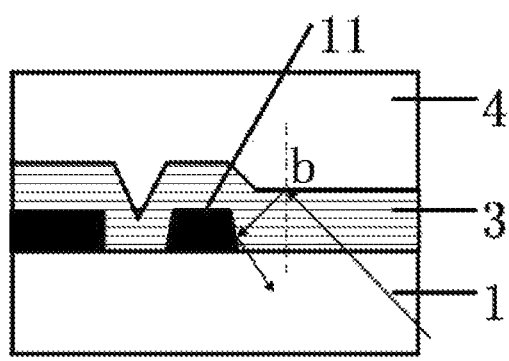
Figure 3C:
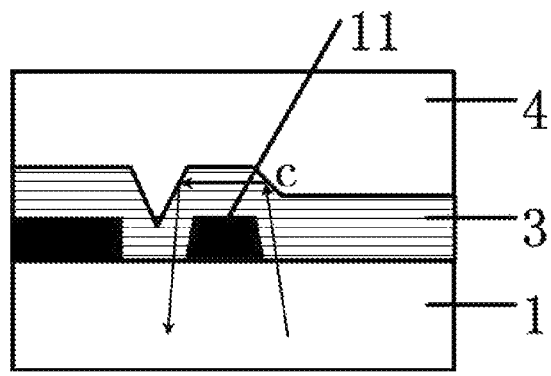

FIGS. 3A-3C are schematic views of a reflection effect of a light blocking portion in accordance with an embodiment of the present disclosure. In FIG. 3A, when incident light is incident to an a-position at the outside of the protrusion formed by the first dielectric layer 3 covering the light blocking portion 11 and far from the protrusion, the incident light, after being reflected by the a-position, is not incident to a side surface of the light blocking portion 11, but is directly emitted out from the substrate 1. In FIG. 3B, when the incident light is incident to a b-position at the outside of the protrusion and closer to the protrusion, the incident light, after being reflected by the b-position, is incident to the side surface of the light blocking portion 11, and then is emitted out from the substrate 1 after being reflected by the light blocking portion 11. In FIG. 3C, when the incident light is incident to the c-position in the protrusion, the incident light, after being reflected by the c-position, is incident to a position of the protrusion which is symmetric with respect to the c-position, and then is directly emitted out from substrate 1 after being reflected by this symmetric position.

By the design of the light blocking portion 11, light incident from both sides of the light shielding layer 2 is emitted out from the thin film transistor, and the incident light can be prevented from propagating between the top surface of the light shielding layer 2 and the top surface of the high refractive index dielectric layer 3. Therefore, the light intensity entering the active layer of the thin film transistor is more effectively reduced. Thus, the light stability of the thin film transistor is more effectively improved.

Figure 4:
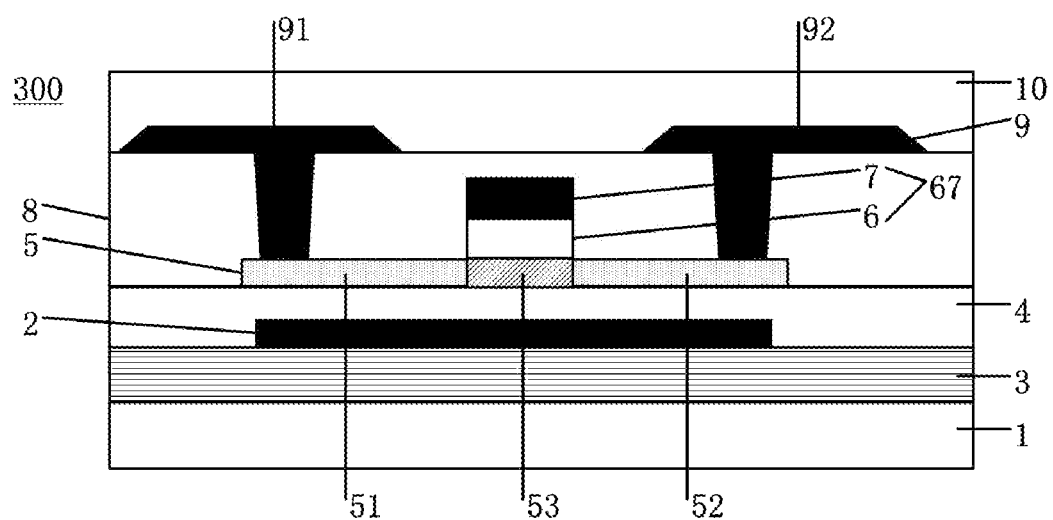
FIG. 4 is a schematic view of a cross section of a thin film transistor in accordance with an embodiment of the present disclosure.

FIG. 4 is a schematic view of a cross section of a thin film transistor in accordance to an embodiment of the present disclosure. FIG. 4 is different from FIG. 1 in that positions of the light shielding layer and the first dielectric layer of the thin film transistor 300 in FIG. 4 are different from those of the thin film transistor 100 in FIG. 1. In FIG. 4, the first dielectric layer 3 is located on the substrate 1, the light shielding layer 2 is located on the first dielectric layer 3, and the second dielectric layer 4 covers the first dielectric layer 3 and the light shielding layer 2. In addition, the same portions of FIG. 4 as those of FIG. 1 are as described above, and will not be repeated again.

In this embodiment, in the case that the thin film transistor is illuminated, light is first incident to the high refractive index dielectric layer, and then the incident light satisfying the total reflection condition is reflected and emitted out from the thin film transistor when it reaches the interface of the high-low refractive index dielectric layer. This reduces the light intensity entering the active layer of the thin film transistor, thereby improving the light stability of the thin film transistor.

In embodiments described herein, there is also provided a method for manufacturing the above-described thin film transistor. Since the thin film transistor includes a high refractive index dielectric layer and a low refractive index dielectric layer, the light intensity entering the active layer can be reduced, thereby improving the light stability of the thin film transistor. A method for manufacturing a thin film transistor provided by an embodiment of the present disclosure will now be described in detail with reference to FIGS. 5 to 22.

Figure 5:
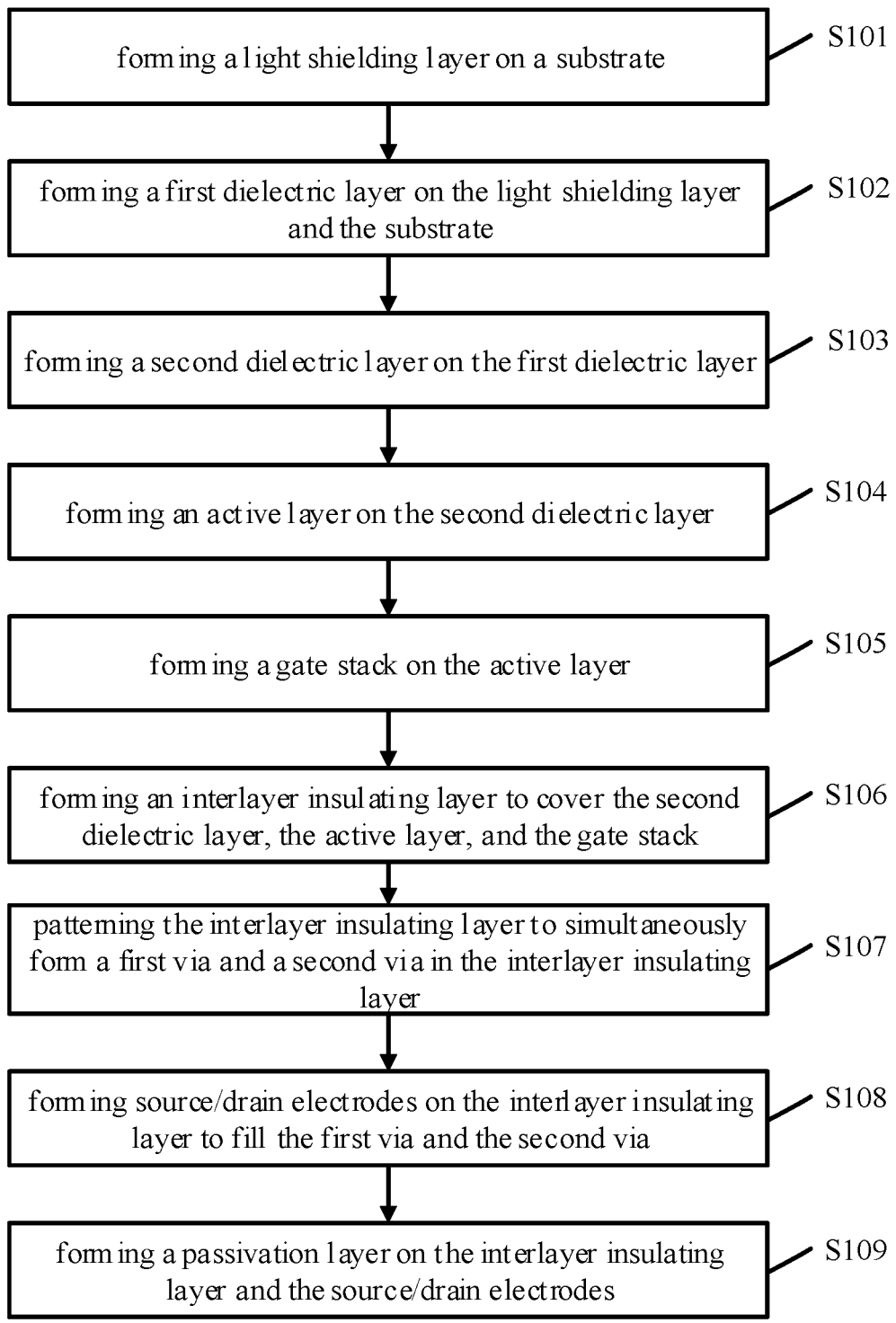
FIG. 5 is a flow chart of a method for manufacturing a thin film transistor in accordance with an embodiment of the present disclosure.
Figure 6:
FIG. 6 is a schematic view of formation of a light shielding layer of a thin film transistor in accordance with an embodiment of the present disclosure.

FIG. 5 is a flow chart of a method for manufacturing a thin film transistor in accordance with an embodiment of the present disclosure. As shown in FIG. 5, in step S101, a light shielding layer is formed on a substrate. FIG. 6 further shows a schematic view of forming the light shielding layer 2.

As shown in FIG. 6, a patterned light shielding layer 2 is formed on the substrate 1.

In an exemplary embodiment, the method of forming the light shielding layer 2 includes a sputtering method or an evaporation method.

Figure 7:
FIG. 7 is a schematic view of formation of a first dielectric layer of a thin film transistor in accordance with an embodiment of the present disclosure.

As shown in FIG. 5, in step S102, a first dielectric layer is formed on the light shielding layer and the substrate. FIG. 7 further shows a schematic view of forming the first dielectric layer 3.

As shown in FIG. 7, the first dielectric layer 3 is formed to completely cover the light shielding layer 2 and the substrate 1.

In an exemplary embodiment, the method of forming the first dielectric layer 3 includes a plasma enhanced chemical vapor deposition method.

Figure 8:
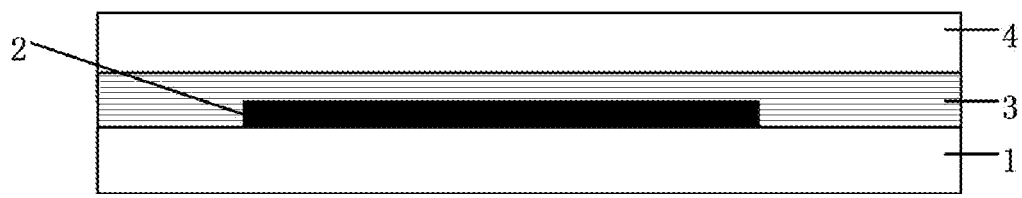
FIG. 8 is a schematic view of formation of a second dielectric layer of a thin film transistor in accordance with an embodiment of the present disclosure.

As shown in FIG. 5, in step S103, a second dielectric layer is formed on the first dielectric layer. FIG. 8 further shows a schematic view of forming the second dielectric layer 4.

As shown in FIG. 8, the second dielectric layer 4 is formed on the first dielectric layer 3.

In an exemplary embodiment, the method of forming the second dielectric layer 4 includes a plasma enhanced chemical vapor deposition method.

Figure 9:
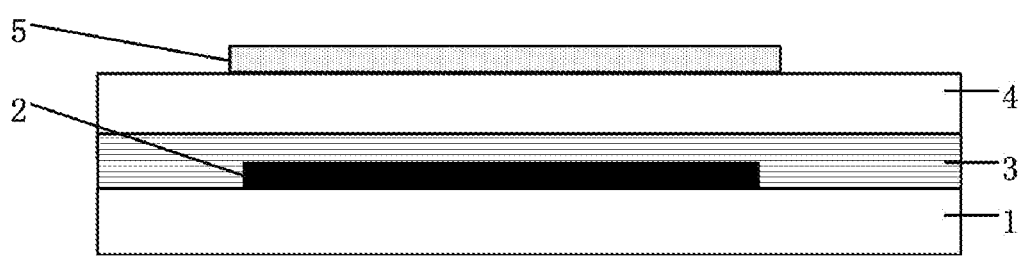
FIG. 9 is a schematic view of formation of an active layer of a thin film transistor in accordance with an embodiment of the present disclosure.

As shown in FIG. 5, in step S104, an active layer is formed on the second dielectric layer. FIG. 9 further shows a schematic view of forming the active layer 5.

As shown in FIG. 9, a patterned active layer 5 is formed on the second dielectric layer 4.

In an exemplary embodiment, the method of forming the active layer 5 includes a sputtering method or an evaporation method.

Figure 10:
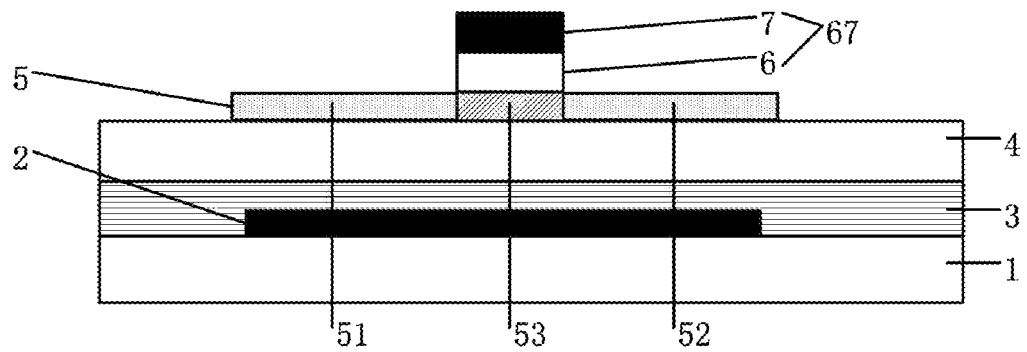
FIG. 10 is a schematic view of formation of a gate stack of a thin film transistor in accordance with an embodiment of the present disclosure.

As shown in FIG. 5, in step S105, a gate stack is formed on the active layer. FIG. 10 further shows a schematic view of forming the gate stack 67.

As shown in FIG. 10, a patterned gate stack 67 is formed on the active layer 5. The active layer 5 includes a channel region 53 located under the gate stack 67 and source/drain regions 51, 52 respectively located on both sides of the channel region. The gate stack 67 includes a gate insulating layer 6 and a gate 7 located on the gate insulating layer 6.

In an exemplary embodiment, a method of forming the gate insulating layer 6 includes a plasma enhanced chemical vapor deposition method. A method of forming the gate 7 includes a sputtering method or an evaporation method.

Figure 11:
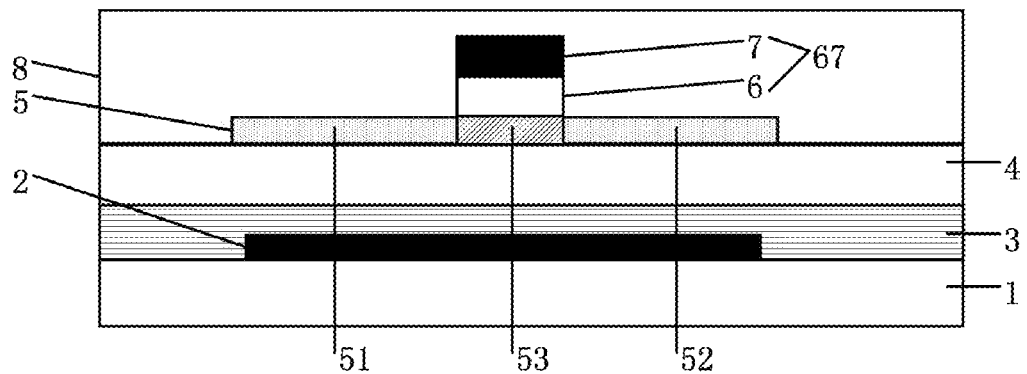
FIG. 11 is a schematic view of formation of an interlayer insulating layer of a thin film transistor in accordance with an embodiment of the present disclosure.

As shown in FIG. 5, in step S106, an interlayer insulating layer is formed to cover the second dielectric layer, the active layer, and the gate stack. FIG. 11 further shows a schematic view of forming the interlayer insulating layer 8.

As shown in FIG. 11, the interlayer insulating layer 8 is formed to cover the second dielectric layer 4, the active layer 5, and the gate stack 67.

In an exemplary embodiment, a method of forming the interlayer insulating layer 8 includes a plasma enhanced chemical vapor deposition method.

Figure 12:
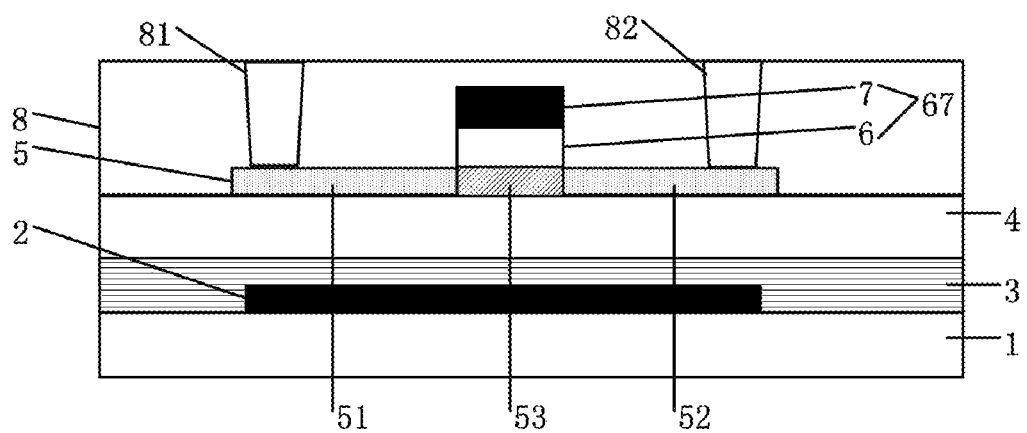
FIG. 12 is a schematic view of formation of vias of a thin film transistor in accordance with an embodiment of the present disclosure.

As shown in FIG. 5, in step S107, the interlayer insulating layer is patterned to simultaneously form a first via and a second via in the interlayer insulating layer. FIG. 12 further shows a schematic view of forming the first via 81 and the second via 82.

As shown in FIG. 12, the interlayer insulating layer 8 is patterned to form the first via 81 exposing the source/drain region 51 and the second via 82 exposing the source/drain region 52 in the interlayer insulating layer 8.

In an exemplary embodiment, the first via 81 and the second via 82 may be formed by dry etching.

Figure 13:
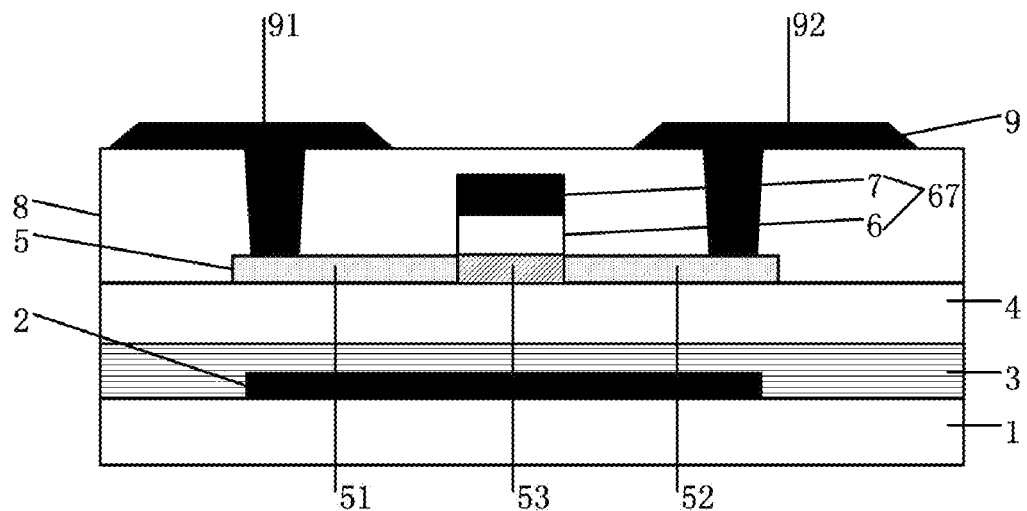
FIG. 13 is a schematic view of formation of source/drain electrodes of a thin film transistor in accordance with an embodiment of the present disclosure.

As shown in FIG. 5, in step S108, source/drain electrodes are formed to fill the first via and the second via on the interlayer insulating layer. FIG. 13 further shows a schematic view of forming the source/drain electrode 91 and the source/drain electrode 92.

As shown in FIG. 13, step S108 further includes forming a conductive layer on the interlayer insulating layer 8, and then patterning the conductive layer to form the source/drain electrode 91 connected to the source/drain region 51 through the first via 81 and the source/drain electrode 92 connected to the source/drain region 52 through the second via 82 on the interlayer insulating layer 8.

In an exemplary embodiment, a method of forming the conductive layer includes a sputtering method.

Figure 14:
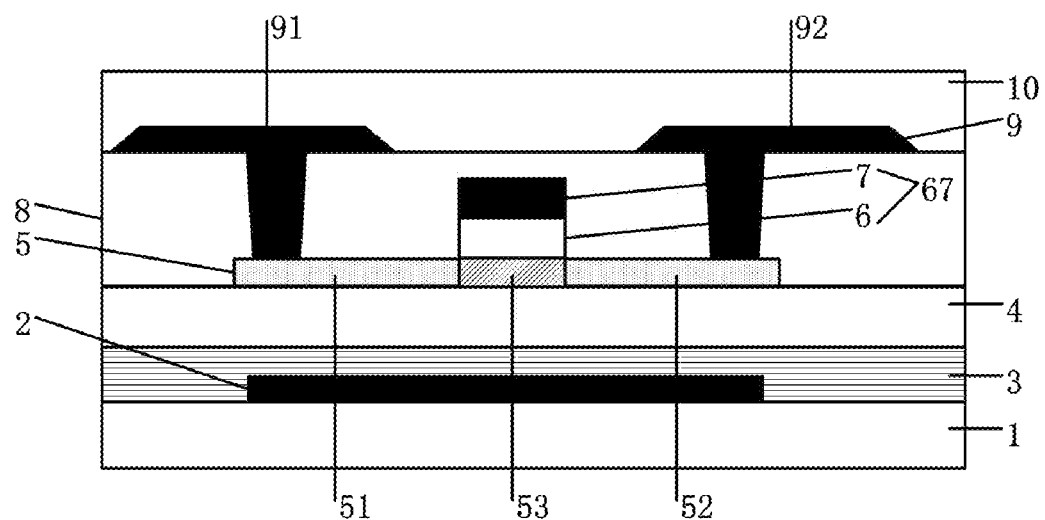
FIG. 14 is a schematic view of formation of a passivation layer of a thin film transistor in accordance with an embodiment of the present disclosure.

As shown in FIG. 5, in step S109, a passivation layer is formed on the interlayer insulating layer and the source/drain electrodes. FIG. 14 further shows a schematic view of forming the passivation layer 10.

As shown in FIG. 14, the passivation layer 10 is formed on the interlayer insulating layer 8, the source/drain electrode 91, and the source/drain electrode 92.

In an exemplary embodiment, the method of forming the passivation layer 10 includes a plasma enhanced chemical vapor deposition method.

Figure 15:
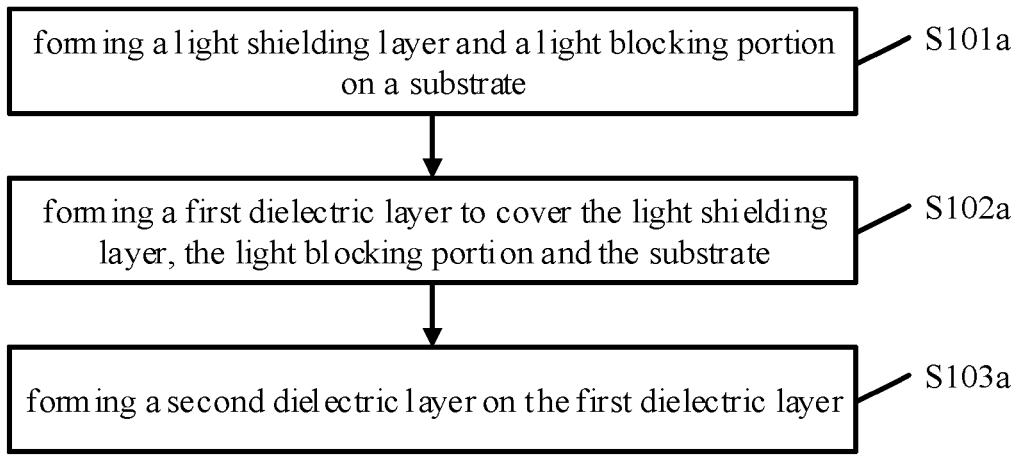
FIG. 15 is a flow chart of a method for manufacturing a thin film transistor in accordance with an embodiment of the present disclosure.
Figure 16:
FIG. 16 is a schematic view of formation of a light shielding layer and a light blocking portion of a thin film transistor in accordance with an embodiment of the present disclosure.
Figure 17:
FIG. 17 is a schematic view of formation of a first dielectric layer of a thin film transistor in accordance with an embodiment of the present disclosure.
Figure 18:
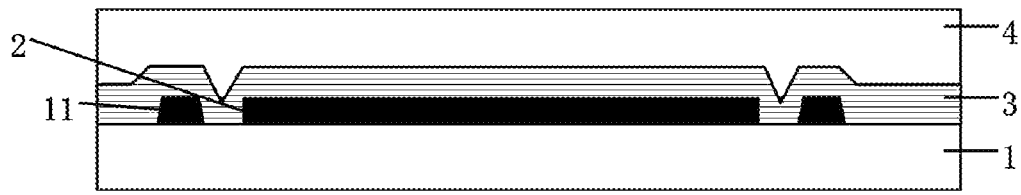
FIG. 18 is a schematic view of formation of a second dielectric layer of a thin film transistor in accordance with an embodiment of the present disclosure.

FIG. 15 is a flow chart showing a method for manufacturing a thin film transistor in accordance with an embodiment of the present disclosure, in which since the steps after forming the second dielectric layer are the same as those of the embodiment shown in FIG. 5, for clarity, these steps are not shown herein. As shown in FIG. 15, FIG. 15 differs from FIG. 5 in that step S101*a* in FIG. 15 further includes forming a light blocking portion on the substrate, step S102*a* is forming a first dielectric layer to cover the light shielding layer, the light blocking portion and the substrate, and step S103*a* is forming a second dielectric layer on the first dielectric layer. FIG. 16 further shows a schematic view of forming the light blocking portion 11. FIG. 17 further shows a schematic view of forming the first dielectric layer 3. FIG. 18 further shows a schematic view of forming the second dielectric layer 4.

As shown in FIG. 16, a patterned light shielding layer 2 and the light blocking portion 11 being in the same layer and spaced apart from the light shielding layer 2 are formed on the substrate 1. The light blocking portion 11 is located on both sides of the light shielding layer 2.

As shown in FIG. 17, a first dielectric layer 3 is formed to cover the light shielding layer 2, the light blocking portion 11, and the substrate 1.

As shown in FIG. 18, a second dielectric layer 4 is formed on the first dielectric layer 3, and the second dielectric layer 4 completely covers the first dielectric layer 3.

In addition, the same steps in FIG. 15 as those of FIG. 5 are as described above, and will not repeated again.

Figure 19:
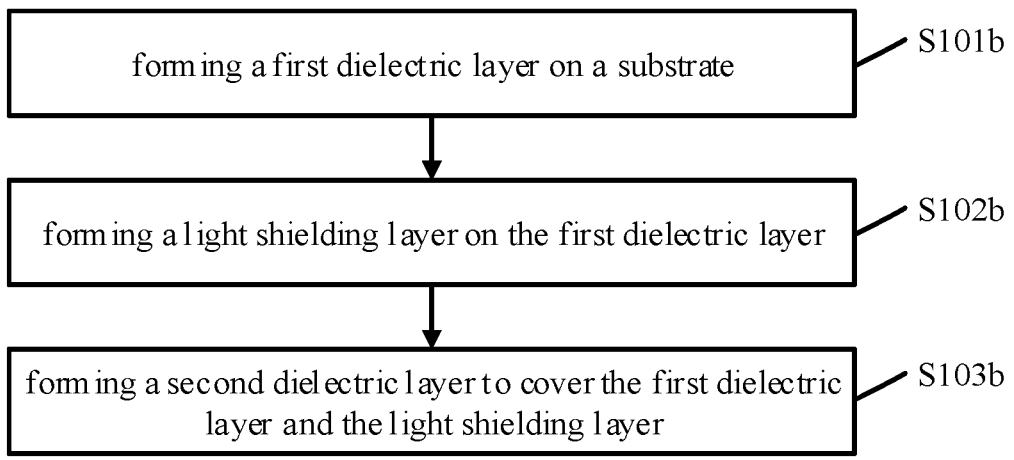
FIG. 19 is a flow chart of a method for manufacturing a thin film transistor in accordance with an embodiment of the present disclosure.
Figure 20:
FIG. 20 is a schematic view of formation of a first dielectric layer of a thin film transistor in accordance with an embodiment of the present disclosure.
Figure 21:
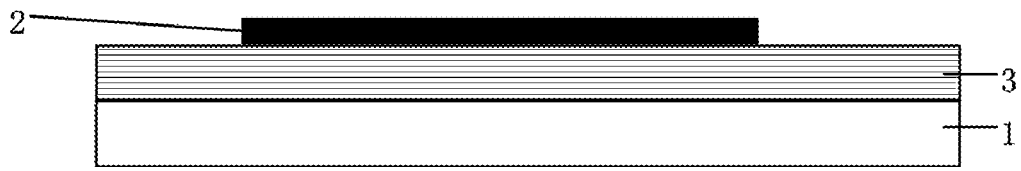
FIG. 21 is a schematic view of formation of a light shielding layer of a thin film transistor in accordance with an embodiment of the present disclosure.
Figure 22:
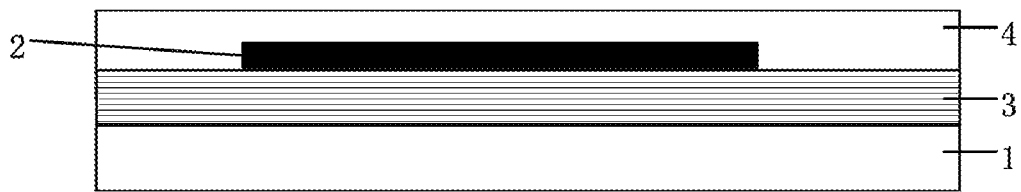
FIG. 22 is a schematic view of formation of a second dielectric layer of a thin film transistor in accordance with an embodiment of the present disclosure.

FIG. 19 is a flow chart showing a method for manufacturing a thin film transistor in accordance with an embodiment of the present disclosure, in which since the steps after forming the second dielectric layer are the same as those of the embodiment showed in FIG. 5, for clarity, these steps are not shown herein. As shown in FIG. 19, FIG. 19 differs from FIG. 5 in that step S101*b* in FIG. 19 is forming a first dielectric layer on a substrate, step S102*b* is forming a light shielding layer on the first dielectric layer, and step S103*b* is forming a second dielectric layer to cover the first dielectric layer and the light shielding layer. FIG. 20 further shows a schematic view of forming the first dielectric layer 3. FIG. 21 further shows a schematic view of forming the light shielding layer 2. FIG. 22 further shows a schematic view of forming the second dielectric layer 4.

As shown in FIG. 20, the first dielectric layer 3 is formed on the substrate 1. As shown in FIG. 21, a patterned light shielding layer 2 is formed on the first dielectric layer 3. As shown in FIG. 22, the second dielectric layer 4 is formed to cover the first dielectric layer 3 and the light shielding layer 2.

In addition, the same steps in FIG. 19 as those of FIG. 5 are as described above, and will not repeated again.

In embodiments described herein, the buffer layer in the thin film transistor employs a combination of a high refractive index dielectric layer and a low refractive index dielectric layer. In a case where light emitted from the light emitting unit illuminates the thin film transistor from the substrate side of the thin film transistor, when light is incident from the high refractive index dielectric layer to the low refractive index dielectric layer, the incident light is reflected out from the substrate by the reflection at the interface of the high refractive index dielectric layer and the low refractive index, or the above-described incident light propagates laterally between the top surface of the light shielding layer and the top surface of the high refractive index dielectric layer. Therefore, the light intensity entering the active layer of the thin film transistor is reduced, thereby improving the light stability of the thin film transistor. In addition, a light reflecting portion being in the same layer as the light shielding layer, located on both sides of the light shielding layer, and located on the substrate of the thin film transistor, such that light can be prevented from propagating between the top surface of the light shielding layer and the top surface of the high refractive index dielectric layer, thereby the light intensity entering the active layer in the thin film transistor is more effectively reduced. Therefore, the light stability of the thin film transistor is more effectively improved.

Embodiments of the present disclosure also provide a display panel including the above-described thin film transistor, which can improve the light stability of the thin film transistor.

Embodiments of the present disclosure also provide a display device including the above-described display panel, which can improve the display effect of the display device.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A thin film transistor comprising:
a substrate;
an active layer located on the substrate;
a light shielding layer, a first dielectric layer, and a second dielectric layer located between the substrate and the active layer, wherein the first dielectric layer is located between the second dielectric layer and the substrate, and wherein a refractive index of the first dielectric layer is greater than a refractive index of the second dielectric layer, and wherein the light shielding layer is located between the substrate and the first dielectric layer; and
at least two light blocking portions in the same layer as the light shielding layer and spaced apart from the light shielding layer on the substrate, wherein the first dielectric layer covers the light shielding layer and the light blocking portions, wherein the light blocking portions are disposed on both sides of the light shielding layer, wherein a material of the light blocking portions is the same as a material of the light shielding layer, and wherein a cross-sectional shape of the light blocking portions comprises one of a triangle, a circle, and a trapezoid,
wherein the second dielectric layer has a first protrusion protruding in a direction perpendicularly facing the substrate, at least a portion of an orthographic projection of the first protrusion on the substrate being located between an orthographic projection of the light shielding layer on the substrate and an orthographic projection of the light blocking portions on the substrate, and
wherein the first dielectric layer has a second protrusion protruding in a direction perpendicularly away from the substrate, the orthographic projection of the light blocking portions on the substrate being located within an orthographic projection of the second protrusion on the substrate.

2. The thin film transistor according to claim 1, wherein the first dielectric layer comprises silicon nitride and the second dielectric layer comprises silicon oxide.

3. The thin film transistor according to claim 1, further comprising:
a gate stack located on the active layer, wherein the active layer comprises a channel region located under the gate stack and source/drain regions respectively located on both sides of the channel region, and wherein the gate stack comprises a gate insulating layer and a gate located on the gate insulating layer;
an interlayer insulating layer located on the second dielectric layer, the active layer, and the gate stack, wherein the interlayer insulating layer comprises vias exposing the source/drain regions;
source/drain electrodes located on the interlayer insulating layer and connected to the source/drain regions through the vias; and
a passivation layer located on the interlayer insulating layer and the source/drain electrodes.

4. A display panel comprising the thin film transistor according to claim 1.

5. A display device comprising the display panel according to claim 4.

6. A method for manufacturing a thin film transistor, the method comprising:
forming a light shielding layer and a first dielectric layer on a substrate;
forming a second dielectric layer on the light shielding layer and the first dielectric layer to cover the light shielding layer and the first dielectric layer, wherein a refractive index of the first dielectric layer is greater than a refractive index of the second dielectric layer, and wherein forming the light shielding layer and the first dielectric layer on the substrate comprises forming the light shielding layer on the substrate, and forming the first dielectric layer on the light shielding layer and the substrate;
forming an active layer on the second dielectric layer; and
forming at least two light blocking portions in the same layer as the light shielding layer and spaced apart from the light shielding layer on the substrate, wherein the first dielectric layer covers the light shielding layer and the light blocking portions, wherein the light blocking portions are disposed on both sides of the light shielding layer, and wherein a material of the light blocking portions is the same as a material of the light shielding layer, and wherein a cross-sectional shape of the light blocking portions comprises one of a triangle, a circle, and a trapezoid,
wherein the second dielectric layer has a first protrusion protruding in a direction perpendicularly facing the substrate, at least a portion of an orthographic projection of the first protrusion on the substrate being located between an orthographic projection of the light shielding layer on the substrate and an orthographic projection of the light blocking portions on the substrate, and
wherein the first dielectric layer has a second protrusion protruding in a direction perpendicularly away from the substrate, the orthographic projection of the light blocking portions on the substrate being located within an orthographic projection of the second protrusion on the substrate.

7. The method according to claim 6, further comprising:
forming a gate stack on the active layer, wherein the active layer comprises a channel region located under the gate stack and source/drain regions respectively located on both sides of the channel region, and wherein the gate stack comprises a gate insulating layer and a gate located on the gate insulating layer;
forming an interlayer insulating layer to cover the second dielectric layer, the active layer, and the gate stack;
patterning the interlayer insulating layer to simultaneously form vias exposing the source/drain regions in the interlayer insulating layer;
forming a conductive layer on the interlayer insulating layer to fill the vias;
patterning the conductive layer to form source/drain electrodes connected to the source/drain regions through the vias; and
forming a passivation layer on the interlayer insulating layer and the source/drain electrodes.

* * * * *